United States Patent
Lee

(10) Patent No.: US 6,797,624 B2
(45) Date of Patent: Sep. 28, 2004

(54) SOLUTION FOR RUTHENIUM CHEMICAL MECHANICAL PLANARIZATION

(75) Inventor: Woo Jin Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 37 days.

(21) Appl. No.: 10/288,058

(22) Filed: Nov. 5, 2002

(65) Prior Publication Data

US 2003/0124867 A1 Jul. 3, 2003

(30) Foreign Application Priority Data

Dec. 29, 2001 (KR) .......................................... 2001-88302

(51) Int. Cl.[7] .............................................. H01L 21/302
(52) U.S. Cl. ...................... 438/692; 438/691; 438/959; 438/690
(58) Field of Search ................................ 438/689, 690, 438/691, 692

(56) References Cited

U.S. PATENT DOCUMENTS

| | | | | |
|---|---|---|---|---|
| 5,804,513 | A | * | 9/1998 | Sakatani et al. ............. 438/693 |
| 6,375,545 | B1 | * | 4/2002 | Yano et al. .................... 451/36 |
| 6,527,818 | B2 | * | 3/2003 | Hattori et al. ................ 51/308 |
| 2002/0006728 | A1 | * | 1/2002 | Matsui et al. ............... 438/693 |
| 2002/0197855 | A1 | * | 12/2002 | Kim et al. ................... 438/650 |
| 2003/0003747 | A1 | * | 1/2003 | Kim et al. ................... 438/693 |
| 2003/0165412 | A1 | * | 9/2003 | Matsui et al. ............ 422/245.1 |

FOREIGN PATENT DOCUMENTS

| | | |
|---|---|---|
| JP | 2000-038573 | 2/2000 |
| JP | 2000-167764 | 6/2000 |

OTHER PUBLICATIONS

Communication from Korean Intellectual Property Office dated Jan. 30, 2004 with translation (4 pages).

* cited by examiner

*Primary Examiner*—John F. Niebling
*Assistant Examiner*—Jennifer M. Kennedy
(74) *Attorney, Agent, or Firm*—Marshall, Gerstein & Borun LLP

(57) ABSTRACT

A solution for ruthenium chemical mechanical planarization containing a nitric acid and an oxidizer is disclosed. A method of forming ruthenium pattern using a polished ruthenium layer is also disclosed. The disclosed solution improves the polishing speed of ruthenium under low polishing pressure, reduces the dishing of ruthenium and decreases scratches generated in the interlayer insulating film. As a result, the disclosed solution and methods improve the techniques for device isolation and reduction of step coverage.

16 Claims, 3 Drawing Sheets

SOLUTION FOR RUTHENIUM CHEMICAL MECHANICAL PLANARIZATION

BACKGROUND OF THE INVENTION

1. Technical Field

A solution for ruthenium chemical mechanical planarization (abbreviated as "CMP") containing a nitric acid and an oxidizer is disclosed. In particular, the forming method of a ruthenium pattern including CMP process using the above solution for ruthenium CMP is disclosed.

2. Description of the Related Art

Ruthenium is a noble metal which is chemically and mechanically stable, and is an essential material used in fabricating high performance semiconductor devices. In addition, ruthenium has been recently used as lower electrode in forming metal layer/insulating film/metal layer-type capacitors in DRAM devices.

However, an appropriate CMP slurry cannot be provided to polish the ruthenium during a CMP process because ruthenium has relatively low reactivity. Thus, the slurries intended for other metals such as tungsten or aluminum are employed when polishing ruthenium.

The slurries intended for other metals include chemicals for planarizing of the various metal layers on a silicon substrate. In general, the slurry for a metal CMP process with a strong acidity of pH 2~4 contains an oxidizer such as hydrogen peroxide ($H_2O_2$) or ferric nitrate ($Fe(NO_3)_2$) and an abrasive such as alumina ($Al_2O_3$) or manganese oxide ($MnO_2$). Further, a small amount of surfactant may be added to improve CMP slurry properties.

The polishing speed of ruthenium is very slow, thus the CMP process is performed for a long period of time under a high polishing pressure in order to adequately planarize the ruthenium.

As a result, the ruthenium layer may be separated from the interlayer insulating film because the ruthenium layer has poor adhesion to the interlayer insulating film. In addition, dishing and erosion effects are generated on the ruthenium layer adjacent to the interlayer insulating film.

Moreover, when ruthenium is polished for a long time under high polishing pressure, the abrasive in the slurry can scratch the interlayer insulating film severely, and impurities such as the slurry grounds are generated and remain behind. Therefore, the property of the resultant device is deteriorated.

SUMMARY OF THE DISCLOSURE

A solution for ruthenium CMP is disclosed which can improve the polishing speed of ruthenium under a low polishing pressure and reduce dishing of ruthenium layer and scratches of the interlayer insulating film.

A method for forming a metal pattern including CMP process using the above solution is also disclosed.

DETAILED DESCRIPTION OF THE PRESENTLY PREFERRED EMBODIMENTS

Figure 1:
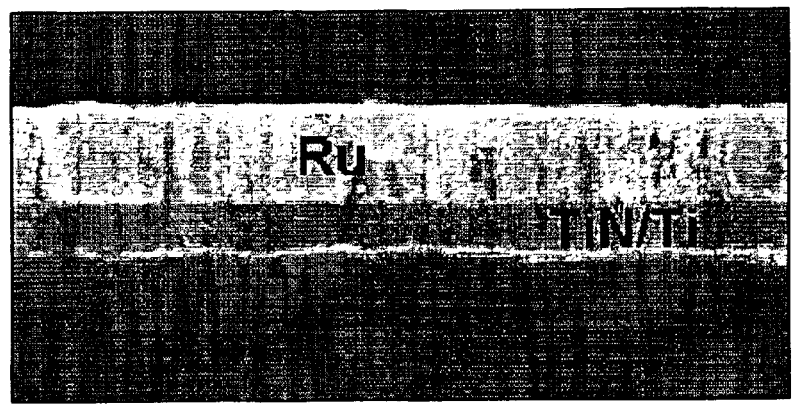
FIG. 1 is a cross-sectional view of the ruthenium-formed metal pattern before ruthenium-CMP process using a disclosed solution.

A CMP solution containing a nitric acid and an oxidizer is disclosed.

The CMP solution is used for polishing and planarizing ruthenium.

The nitric acid preferably has a concentration ranging from about 0.01 to about 10 M, preferably about 0.01 to about 5 M and a pH ranging from about 1 to about 5, preferably about 1 to about 3. When the concentration of nitric acid is less than 0.1 M, the performance of the oxidizer, such as ceric ammonium nitrate [$(NH_4)_2Ce(NO_3)_6$] is diminished.

One preferred oxidizer which oxidizes the ruthenium is ceric ammonium nitrate and is included in a concentration ranging from about 0.01 to about 10 M preferably about 0.01 to about 5 M in the nitric acid.

It is preferable that CMP solution comprising nitric acid maintains its pH ranging from about 1 to about 5, preferably about 1 to about 3, even when the oxidant is added therein.

The ruthenium CMP solution changes the physical and chemical properties of the surface of ruthenium layer by way of the nitric acid in combination with a suitable oxidizer.

That is, using the disclosed CMP solution, the bonding strength and compactness between ruthenium atoms are decreased, erosion and dissolution speed of the surface of ruthenium layer are increased, and polishing speed under the same pressure is improved, resulting in a ruthenium layer that is easily planarized.

In addition, in comparison with conventional slurry, the ruthenium CMP solution includes no abrasive and thus decreases scratches generated in the interlayer insulating film.

A method for preparing the disclosed ruthenium CMP solution will be described. First, a 0.01~10 M of nitric acid is prepared, and then the ceric ammonium nitrate is added thereto and is stirred to have a concentration of ceric ammonium nitrate in the range of 0.01~10 M.

Thereafter, the resulting mixture is further stirred for about 30 minutes so that it is completely mixed and stabilized.

A method for forming a ruthenium pattern using the disclosed ruthenium CMP solution, comprises:
  (a) forming an interlayer insulating film pattern having a contact hole on a semiconductor substrate;
  (b) forming a ruthenium layer on the interlayer insulating film pattern; and
  (c) performing a ruthenium CMP process on the overall surface of the ruthenium layer using the disclosed solution.

Step (c) may further comprise touch-polishing process upon the resultant of step (c) using slurry for an interlayer insulating film.

In the first CMP process, the ruthenium-formed semiconductor substrate is contacted to a polishing pad formed on a rotary table of a CMP system under pressure.

Then, the disclosed ruthenium CMP solution is supplied to an interface of the polishing pad and the ruthenium layer, and the ruthenium layer is polished.

The CMP process is performed under pressure ranging from about 1 to about 3 psi, at a table revolution of a rotary type system ranging from about 10 to about 80 rpm, and at a linear table speed ranging from about 100 to about 600 fpm, depending upon the polishing speed of the ruthenium layer and the polishing property of the interlayer insulating film.

In the second CMP process, touch polishing of interlayer insulating film is performed at the time the interlayer insulating film is exposed, using CMP slurry for interlayer insulating film. The touch polishing is buffering step to prevent ruthenium layer from dishing generated by the difference in polishing selectivity between ruthenium layer and interlayer insulating film.

Various type of polishing pads can be used in the above CMP process according to the polishing properties of the ruthenium layer. For example, a soft pad can be used to raise uniformity of the polished layer and a hard pad can be used to improve planarity. And a stack pad laminated with the above two pads or the combination of the above pads can be also used.

In addition, a metal adhesion layer, such as titanium (Ti) or titanium nitride (TiN) can be formed on the top surface of the interlayer insulating film before forming ruthenium layer so as to improve adhesiveness of ruthenium (see FIG. 1).

That is, method for forming a ruthenium pattern may comprise:

(a) forming an interlayer insulating film pattern having a contact hole on a semiconductor substrate;

(b) forming a metal adhesion layer on the interlayer insulating film pattern;

(c) forming a ruthenium layer on the metal adhesion layer;

(d) performing a ruthenium CMP process on the overall surface of the ruthenium layer using the disclosed CMP solution until the metal adhesion layer is exposed;

(e) performing a CMP process on the resultant surface using a metal slurry until the interlayer insulating film is exposed; and (f) performing touch-polishing process upon the resultant surface using slurry for an interlayer insulating film.

Preferably, the interlayer insulating pattern is an oxide pattern, and the ruthenium pattern is used as the lower electrode pattern.

In the first CMP process, ruthenium-formed semiconductor substrate is contacted with a polishing pad formed on a rotary table of a CMP system under pressure.

Then, the disclosed ruthenium CMP solution is supplied to an interface of the polishing pad and the ruthenium layer, and the ruthenium layer is polished.

The CMP process is performed under pressure ranging from about 1 to about 3 psi, at a table revolution number of a rotary type system ranging from about 10 to about 80 rpm, and a linear table movement speed ranging from about 100 to about 600 fpm, depending upon the polishing speed of the ruthenium layer and the polishing property of the interlayer insulating film.

Figure 2:
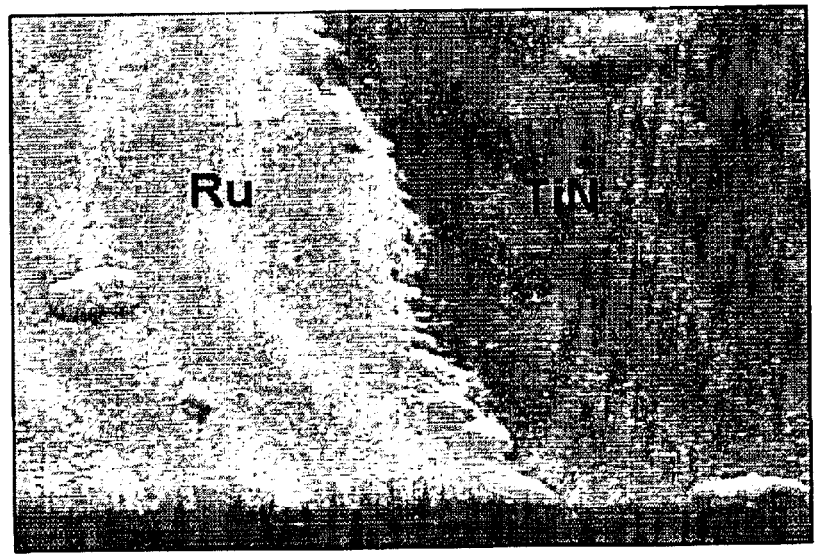
FIG. 2 is a front view of the metal pattern after ruthenium-CMP process using a disclosed solution.

In the second CMP process, the metal adhesion layer is polished (see FIG. 2).

Figure 3:
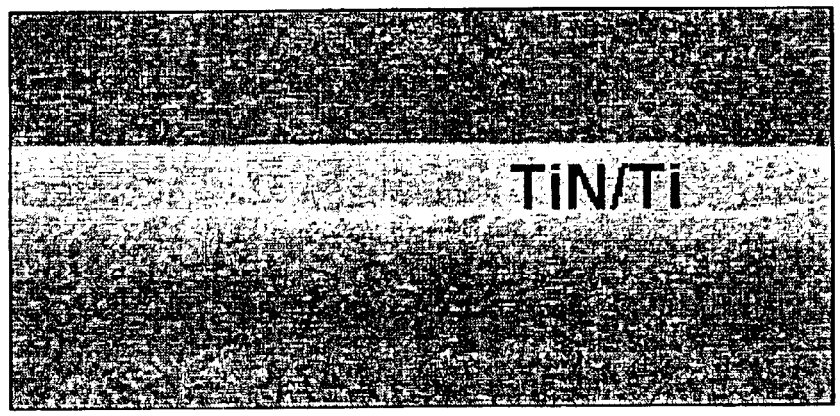
FIG. 3 is a cross-sectional view of the ruthenium-eliminated metal pattern after ruthenium-CMP process using a disclosed solution.

In the third CMP process, touch polishing of interlayer insulating film is performed at the time the interlayer insulating film is exposed, using the CMP slurry for an interlayer insulating film (see FIG. 3). The touch polishing is buffering step to prevent ruthenium layer from dishing generated by the difference in polishing selectivity between metal adhesion layer and interlayer insulating film.

The above CMP slurry for a metal and an oxide film is used the general slurry.

As discussed earlier, the disclosed CMP process is performed by using the disclosed ruthenium CMP solution containing ceric ammonium nitrate in a nitric acid, which improves the polishing speed of ruthenium under a low polishing pressure and reduces the dishing of ruthenium layer.

In addition, the disclosed solution decreases scratches generated in the interlayer insulating film because the solution does not contain an abrasive.

As a result, an improved technique for device isolation and reduction of step coverage is disclosed.

What is claimed is:

1. A CMP solution for polishing ruthenium comprising a nitric acid and an oxidizer; and wherein the CMP solution is free of abrasives.

2. The solution according to claim 1, wherein a concentration of nitric acid ranges from about 0.01 M to about 10 M.

3. The solution according to claim 2, wherein a concentration of nitric acid ranges from about 0.01 M to about 5 M.

4. The solution according to claim 1, wherein a pH of the solution ranges from about 1 to about 5.

5. The solution according to claim 4, wherein a pH of the solution ranges from about 1 to about 3.

6. The solution according to claim 1, wherein the oxidizer is ceric ammonium nitrate $[(NH_4)_2Ce(NO_3)_6]$.

7. The solution according to claim 1, wherein the oxidizer is present in a concentration ranging from about 0.01 M to about 10 M.

8. The solution according to claim 7, wherein the oxidizer is present in concentration ranging from about 0.01 M to about 5 M.

9. A CMP solution for polishing ruthenium consisting essentially of a nitric acid and an oxidizer and that is substantially free of abrasive materials.

10. The solution according to claim 9, wherein a concentration of nitric acid ranges from about 0.01 M to about 10 M.

11. The solution according to claim 10, wherein a concentration of nitric acid ranges from about 0.01 M to about 5 M.

12. The solution according to claim 9, wherein a pH of the solution ranges from about 1 to about 5.

13. The solution according to claim 12, wherein a pH of the solution ranges from about 1 to about 3.

14. The solution according to claim 9, wherein the oxidizer is ceric ammonium nitrate $[(NH_4)_2Ce(NO_3)_6]$.

15. The solution according to claim 9, wherein the oxidizer is present in a concentration ranging from about 0.01 M to about 10 M.

16. The solution according to claim 15, wherein the oxidizer is present in a concentration ranging from about 0.01 M to about 5 M.

* * * * *